(12) United States Patent
Milne

(10) Patent No.: US 9,960,101 B2
(45) Date of Patent: May 1, 2018

(54) MICRO-HOSES FOR INTEGRATED CIRCUIT AND DEVICE LEVEL COOLING

(71) Applicant: Raytheon Company, Waltham, MA (US)

(72) Inventor: Jason G. Milne, Hawthorne, CA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/172,690

(22) Filed: Jun. 3, 2016

(65) Prior Publication Data

US 2016/0358842 A1 Dec. 8, 2016

Related U.S. Application Data

(60) Provisional application No. 62/170,896, filed on Jun. 4, 2015, provisional application No. 62/252,909, filed on Nov. 9, 2015.

(51) Int. Cl.

| | |
|---|---|
| *H02B 1/00* | (2006.01) |
| *H01L 23/34* | (2006.01) |
| *H01L 23/473* | (2006.01) |
| *H01L 23/367* | (2006.01) |
| *H01L 23/66* | (2006.01) |

(Continued)

(52) U.S. Cl.
CPC ........ *H01L 23/473* (2013.01); *H01L 21/4846* (2013.01); *H01L 21/4871* (2013.01); *H01L 23/3675* (2013.01); *H01L 23/66* (2013.01); *H01L 24/17* (2013.01); *H05K 1/0209* (2013.01); *H05K 1/0272* (2013.01); *H05K 7/20* (2013.01); *H01L 23/433* (2013.01); *H01L 23/46* (2013.01); *H01L 2223/6683* (2013.01); *H01L 2224/16225* (2013.01); *H01L 2224/2918* (2013.01); *H01L 2224/29144* (2013.01); *H01L 2924/1423* (2013.01)

(58) Field of Classification Search
CPC .......... H05K 7/20; H01L 23/46; H01L 23/473
USPC .......................................... 361/669; 257/712
See application file for complete search history.

(56) References Cited

U.S. PATENT DOCUMENTS

| | | | |
|---|---|---|---|
| 8,081,478 | B1 | 12/2011 | Drexler et al. |
| 8,567,477 | B2 | 10/2013 | Rocco et al. |

(Continued)

FOREIGN PATENT DOCUMENTS

| | | |
|---|---|---|
| EP | 2 804 456 A2 | 11/2014 |
| WO | 2014/146056 A1 | 9/2014 |

OTHER PUBLICATIONS

International Preliminary Report on Patentability for corresponding Patent Application No. PCT/US2016/035714 dated Dec. 5, 2017.

*Primary Examiner* — David Vu
*Assistant Examiner* — Brandon Fox
(74) *Attorney, Agent, or Firm* — Renner, Otto, Boisselle & Sklar, LLP

(57) ABSTRACT

A heat-dissipating device includes at least one heat-dissipating surface and a micro-sized cooling mechanism formed directly on the heat-dissipating surface by an additive manufacturing process. The cooling mechanism includes at least one fluid passage, such as a micro-hose, for carrying a cooling medium from a coolant source directly to the heat-dissipating surface. The cooling mechanism is fluidly sealed to the heat-dissipating surface such that the cooling medium is in thermal contact directly with the heat-dissipating surface.

20 Claims, 7 Drawing Sheets

(51) Int. Cl.

| | |
|---|---|
| *H01L 21/48* | (2006.01) |
| *H01L 23/00* | (2006.01) |
| *H05K 7/20* | (2006.01) |
| *H05K 1/02* | (2006.01) |
| H01L 23/46 | (2006.01) |
| H01L 23/433 | (2006.01) |

(56) References Cited

U.S. PATENT DOCUMENTS

| | | | |
|---|---|---|---|
| 8,627,876 B2 | 1/2014 | Rocco et al. | |
| 9,307,674 B2* | 4/2016 | Chainer | H05K 7/20772 |
| 2006/0090489 A1* | 5/2006 | Haws | H05K 5/0213 |
| | | | 62/176.6 |
| 2010/0175866 A1* | 7/2010 | Tani | G01R 31/2874 |
| | | | 165/287 |
| 2012/0090817 A1* | 4/2012 | Reid | G06F 1/20 |
| | | | 165/80.2 |
| 2014/0332949 A1 | 11/2014 | Davis | |
| 2015/0003012 A1 | 1/2015 | Baba et al. | |
| 2015/0276196 A1* | 10/2015 | Uchida | B41J 11/002 |
| | | | 347/102 |
| 2015/0351290 A1* | 12/2015 | Shedd | H05K 7/20809 |
| | | | 361/679.47 |
| 2016/0286690 A1* | 9/2016 | Wu | H05K 7/2079 |

* cited by examiner

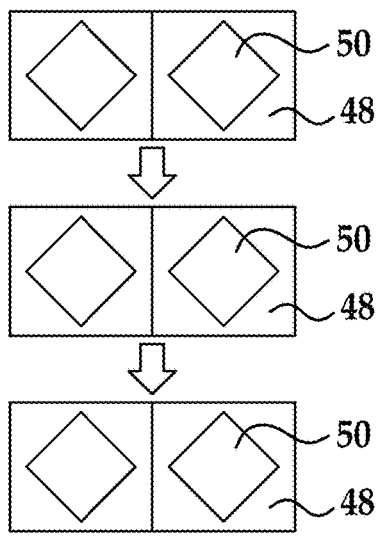
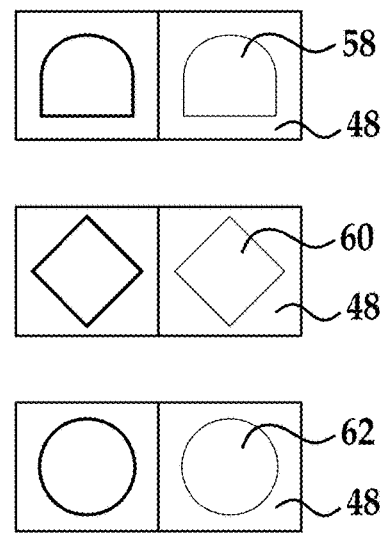
FIG. 5A  FIG. 5B
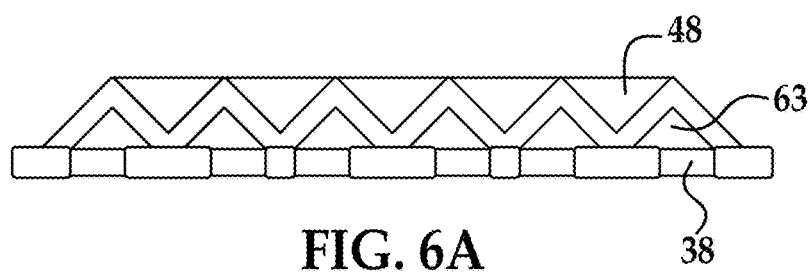
FIG. 6A
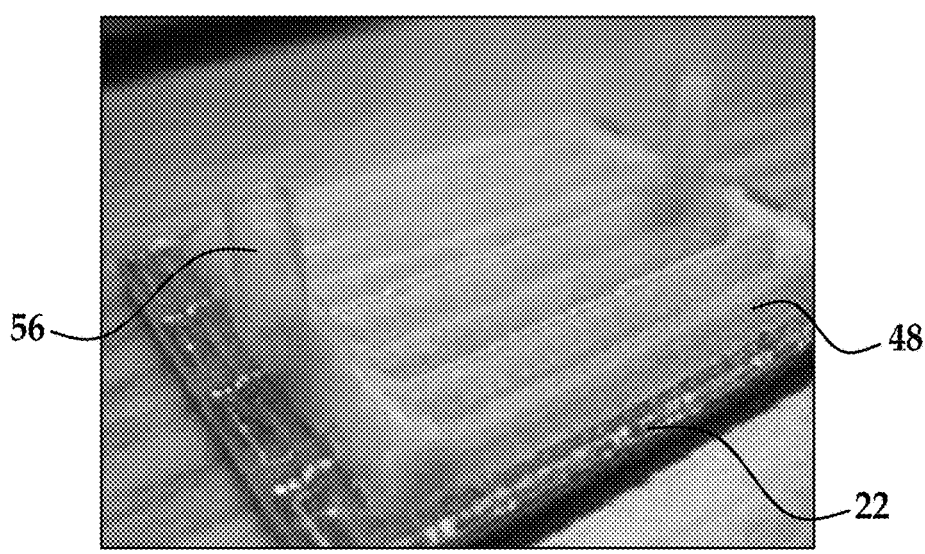
FIG. 6B

MICRO-HOSES FOR INTEGRATED CIRCUIT AND DEVICE LEVEL COOLING

RELATED APPLICATIONS

This application claims the benefit of U.S. Provisional Application No. 62/170,896, filed Jun. 4, 2015, and U.S. Provisional Application No. 62/252,909, filed Nov. 9, 2015, both of which are hereby incorporated by reference in their entirety.

FIELD OF THE INVENTION

The invention relates to cooling for small devices, and more particularly to cooling circuit boards.

DESCRIPTION OF THE RELATED ART

Various applications implement components that require cooling, such as applications that implement electronic components. In particular applications, the electronic components may be relatively small. Electronic chassis assemblies or modules may include small electronic components, such as circuit boards or cards. Efficient operation of the module may rely on managing the heat generated by the micro-sized electronic components.

One conventional method of cooling micro-sized electronic components includes using separate cooling manifolds or structures that are bonded to the electronics assembly. Cooling structures, such as monolithic or metallic cold walls, may be separately formed and then attached to the electronics assembly with solder, epoxy, or other connectors. However, fabrication of the cooling structures may be complicated and expensive due to the complexity of forming a reliable seal between the components. Fluidic spreaders may also be used, enabling fluid to be pumped to the spreader via large fluid hoses and connectors. However, using the fluidic spreaders and bulky connectors may be disadvantageous given the space constraints of the electronic assembly and associated components.

Another conventional method includes immersion cooling. However, immersion cooling generally requires large housings that are bulky and prone to leakage. Other methods include using a fluid delivery source and providing fluid delivery through a channelized chip that is sealed via an epoxy seal, or o-ring. However, as aforementioned, forming a reliable seal between the components may require a complex and costly fabrication of the electronic component.

SUMMARY OF THE INVENTION

Additive manufacturing enables complex or micro-sized hollow features to be formed or printed directly on a small sized heat-dissipating device, such as a circuit board. The hollow feature may be in the form of a micro-hose. The micro-hose may be in communication with a coolant source and may be sealed directly to the circuit board without additional bonding material or bulky connecting components. Delivering a coolant, such as a fluid, directly to the electronic device enables more efficient cooling of the device and incites a greater overall power output from the device.

According to an aspect of the invention, a heat-dissipating device includes at least one heat-dissipating surface and a cooling mechanism formed directly on the at least one heat-dissipating surface. The cooling mechanism includes at least one fluid passage for carrying a cooling medium, and the cooling mechanism is fluidly sealed to the at least one heat-dissipating surface, the cooling medium being in thermal contact directly with the heat-dissipating surface.

According to an aspect of the invention, the at least one fluid passage may include at least one fluid supply path and at least one fluid return path. The at least one fluid supply path delivers the cooling medium to the heat-dissipating surface.

According to an aspect of the invention, the at least one fluid supply path and the at least one fluid return path may be parallel to one another.

According to an aspect of the invention, the at least one fluid supply path and the at least one fluid return path may be configured to overlap without mixing the cooling medium of each of the at least one fluid supply path and the at least one fluid return path.

According to an aspect of the invention, the cooling mechanism may include at least one additively manufactured micro-hose.

According to an aspect of the invention, the cooling mechanism may include a channel containing a fluid supply micro-hose and a fluid return micro-hose, the fluid supply micro-hose delivering the cooling medium to the heat-dissipating surface.

According to an aspect of the invention, the at least one micro-hose may be formed of polyimide, benzocyclobutene, nylon, polyetheretherketone, acrylonitrile-butadiene-styrene, or acryl-based plastic (ABS), poly-lactic acid (PLA).

According to an aspect of the invention, the heat-dissipating device may include a first heat-dissipating surface and a second heat-dissipating surface arranged on the first heat-dissipating surface, where the at least one fluid passage is arranged over the first heat-dissipating surface and the second heat-dissipating surface.

According to an aspect of the invention, each of the first heat-dissipating surface and the second heat-dissipating surface may include a horizontal portion and a vertical portion, where the at least one fluid passage extends along the horizontal portion and the vertical portion of each of the first heat-dissipating surface and the second heat-dissipating surface, such that the at least one fluid passage wraps around the heat-dissipating device.

According to an aspect of the invention, the cooling mechanism may include an exterior wall that defines the at least one fluid passage. The wall may have a shape that is a diamond, a circle, a hemi-circle, triangular, pentagonal, or elliptical.

According to an aspect of the invention, the at least one fluid passage may be freestanding and unsupported.

According to an aspect of the invention, the heat-dissipating device may include at least one pumped coolant source that is in communication with the heat-dissipating surface via the at least one fluid passage.

According an aspect of the invention, the heat-dissipating device may include at least one surface to be heated, and a heating mechanism formed directly on the at least one surface to be heated, where the heating mechanism includes at least one fluid passage for carrying a heating medium, and where the heating mechanism is fluidly sealed to the at least one surface such that the heating medium is in thermal contact directly with the at least one surface.

According to an aspect of the invention, a printed circuit board having at least one active or passive circuit may include a printed wire board, a cooling medium source, and a cooling channel printed directly to the printed wire board. The cooling channel contains a fluid supply micro-hose and a fluid return micro-hose that are in fluid communication between the cooling medium source and the printed wire board. The fluid supply micro-hose delivers a cooling medium directly to the printed wire board.

According to an aspect of the invention, the printed circuit board may include a monolithic microwave integrated circuit arranged on the printed wire board, wherein the cooling channel has a serpentine path that extends over the printed wire board and the monolithic integrated circuit.

According to an aspect of the invention, a method of forming a heat-dissipating device includes using an additive manufacturing process to form a cooling mechanism directly on a heat-dissipating surface of the heat-dissipating device. The cooling mechanism includes at least one fluid passage for carrying a cooling medium to the heat-dissipating surface and the cooling mechanism is fluidly sealed to the at least one heat-dissipating surface for direct thermal contact between the cooling medium and the at least one heat-dissipating surface.

According to an aspect of the invention, using the additive manufacturing process may include at least one of 3D printing, dispensing, lithography, atomic layer deposition, stencil or screen printing, fused or vapor deposition, stamp transfer, sintering, and lamination.

According to an aspect of the invention, forming the cooling mechanism may include forming a channel containing a fluid supply micro-hose and a fluid return micro-hose, where the fluid supply micro-hose is configured to deliver the cooling medium to the at least one heat-dissipating surface.

According to an aspect of the invention, forming the channel may include forming the fluid supply micro-hose and the fluid return micro-hose to be parallel with one another.

According to an aspect of the invention, forming the heat-dissipating device may include forming a printed circuit board.

According to an aspect of the invention, forming the printed circuit board assembly may further include printing the cooling mechanism onto a printed wire board of the circuit board assembly, and printing the cooling mechanism onto a circuit device or a monolithic microwave integrated circuit arranged on the printed wire board. The cooling mechanism may be in simultaneous thermal contact with the printed wire board and the monolithic microwave integrated circuit.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 5A is a schematic drawing showing a channel having diamond shaped micro-hoses.

FIG. 5B is a schematic drawing showing a channel having micro-hoses with varying shapes.

FIG. 6A is a schematic drawing showing a channel with micro-hoses that are triangular in shape.

FIG. 6B is a drawing showing the micro-hose of FIG. 6A printed on a circuit board.

Figure 1:
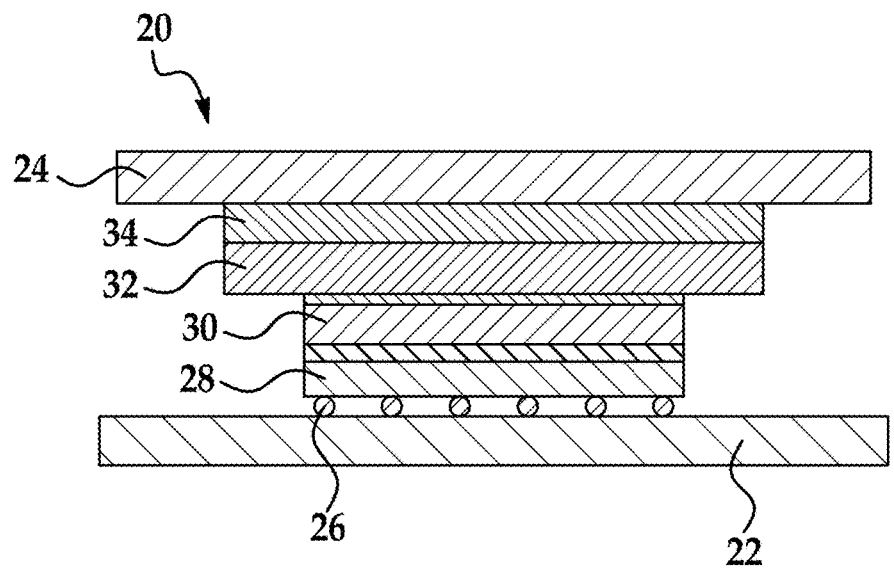
FIG. 1 is a schematic drawing showing a thermal path of an electronic module according to the prior art.

The annexed sheets, which are not necessarily to scale, show various and describe in text various aspects of the invention and related materials.

DETAILED DESCRIPTION

The principles described herein have particular application in the additive manufacturing process of forming a cooling mechanism for a heat-dissipating device. The cooling mechanism as described herein may be feasible in a variety of applications, such as for cooling an electronics chassis assembly or in any application where micro-sized components require cooling. Using additive manufacturing is advantageous for directly printing the cooling mechanism on the heat-dissipating device due to the capabilities of additive manufacturing in forming complex internal features. Examples of complex internal features may include unsupported hollow features such as small cooling passages or channels for allowing a coolant to pass therethrough. For example, a micro-hose structure may be directly printed onto a circuit board using an additive manufacturing process, enabling a cooling medium to be directly delivered to the circuit board.

Referring now to FIGS. 1-6, a cooling mechanism according to the present application may be directly formed on a heat-dissipating device, as opposed to a conventional cooling methods. Directly printing the cooling mechanism to the device enables a fluidic seal to be created as the printing occurs, without using additional connectors or components. As shown in the prior art of FIG. 1, a conventional electronic module 20 includes a printed wire board 22 and a cold wall 24 for providing a cooling medium, such as a cooling fluid, to the printed wire board 22. Cooling the printed wire board 22 is advantageous in that cooling the printed wire board 22 increases the efficiency of the electronics and enables an overall power increase of the module 20. For example, the module 20 may operate at frequencies between 1 and 8 gigahertz and cooling the electronics may enable a power increase of up to 100 watts at a particular frequency. As arranged between the printed wire board 22 and the cold wall 24, the conventional module 20 includes circuit bumps 26 between the printed wire board 22 and a monolithic microwave integrated circuit (MMIC) 28 and a tape automated bonded layer 30 between the MMIC 28 and a heat spreader 32. The automated bonded layer 30 may be formed of copper molybdenum. A thermal interface material 34 is also provided between the heat spreader 32 and the cold wall 24. The printed wire board 22 is relatively small in size, having a width and length of approximately 5.5 millimeters by 3.8 millimeters. Due to the size constraint of the printed wire board 22, standard size hoses and other fluid connectors for delivering cooling fluid to the printed wire board 22 may be incompatible with the module 20. Furthermore, scaling down conventional fluid connectors to a micro level may not be feasible due to manufacturing limitations.

Figure 2:
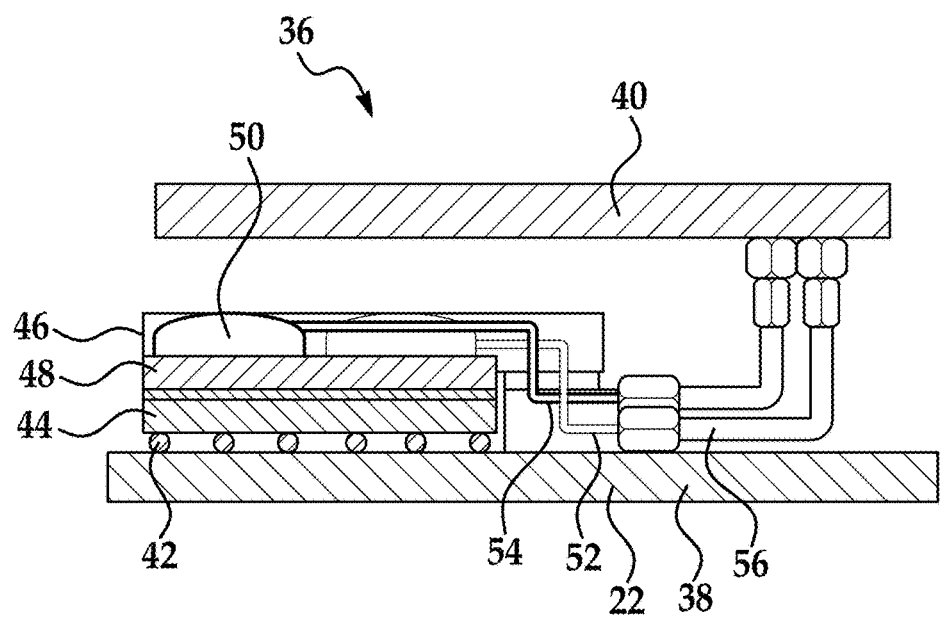
FIG. 2 is a schematic drawing showing a thermal path of an electronic module having a printed circuit board with additively manufactured micro-hoses printed to the circuit board.
Figure 3:
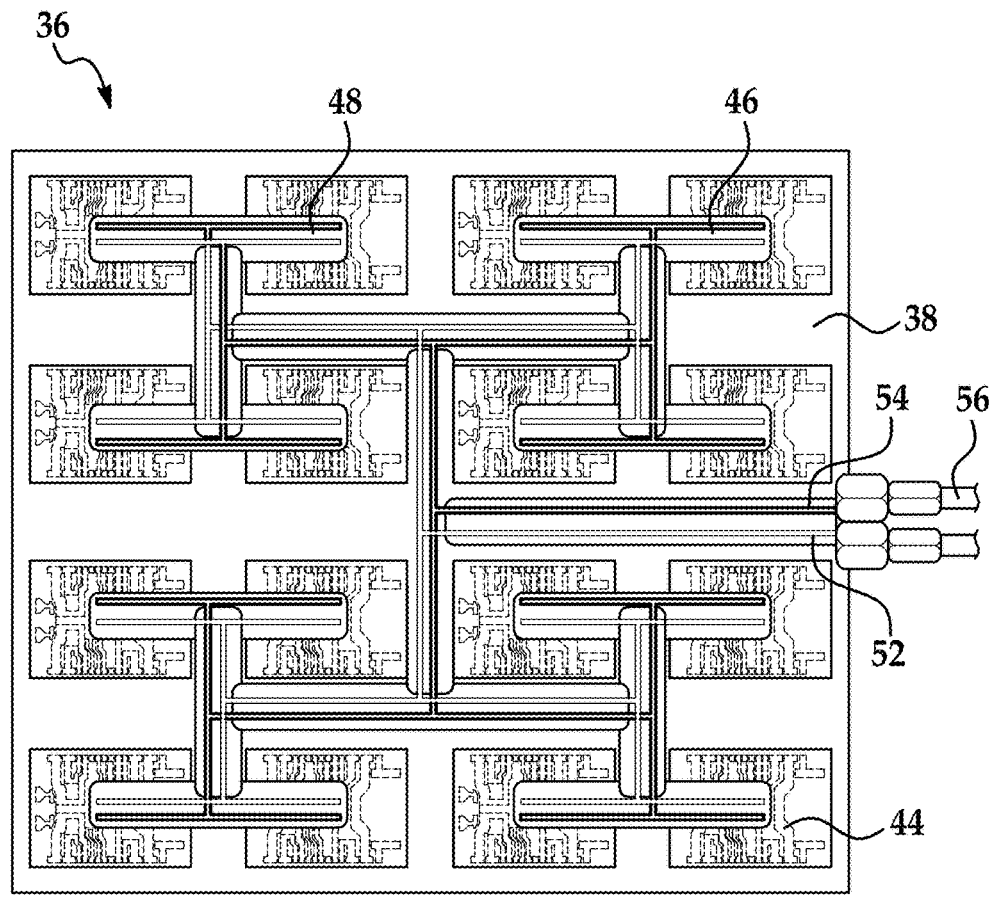
FIG. 3 is a schematic drawing showing the printed circuit board of the electronic module of FIG. 2.
Figure 4:
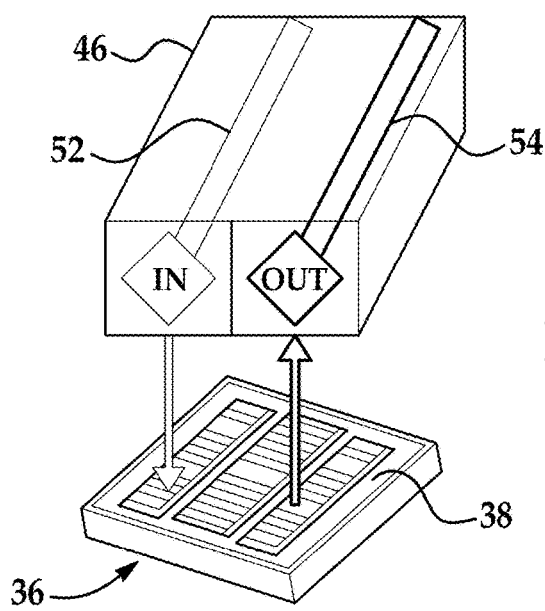
FIG. 4 is a schematic drawing of a detailed portion of the printed circuit board of FIG. 3, showing a channel with micro-hoses.

Referring now to FIGS. 2-4, a heat-dissipating device 36 according to the principles of the present application is shown. The heat-dissipating device 36 may include a heat-dissipating surface 38. The heat-dissipating device 36 may be an electronic module and the heat-dissipating surface 38 may include the printed wire board 22 (circuit board) or another heat-dissipating surface of the circuit board. The heat-dissipating device 36 may be any suitable heat-dissipating device or heat-dissipating components of a device. Examples of suitable heat-dissipating components or devices may include at least one of electrical devices, circuits, processors, field-programmable gate arrays (FPGAs), limiters, diodes, laser diodes, or resistors. Many other suitable devices may implement the principles described herein. Other examples of heat-dissipating devices may include non-electrical devices. Examples of non-electrical devices may include devices used in fuel generation systems and automotive applications.

The heat-dissipating device 36 may include a source 40 of a cooling medium. The source 40 may be a reservoir for supplying a cooling fluid, a cold wall, air hose, fluid hose, heat sink, connector, or fan. Any suitable cooling source for the heat-dissipating device 36 may be used. The cooling source may be a pumped source. The heat-dissipating surface 38 may include the circuit bumps 42 and the MMIC 44, as in the conventional electronic module 20. In contrast to the conventional module 20 of FIG. 1, the heat-dissipating device 36 includes a cooling mechanism 46 printed or formed directly on the heat-dissipating surface 38, by way of an additive manufacturing process. The printed cooling mechanism may be implemented at multiple levels of the circuit assembly hierarchy, such as onto a die, a device package or overmolded device, such as a field-programmable gate array or processor, or at the circuit card assembly level to enable multi-level fluid routing.

The cooling mechanism 46 is formed by additive manufacturing such that the features of the cooling mechanism 46 are deposited directly onto the heat-dissipating surface 38 without altering the heat-dissipating surface 38 or heat-dissipating device 36. The cooling mechanism 46 may include at least one hollow feature such as a fluid passage, channel, opening, conduit, duct, nozzle, or guide for coolant. The coolant may be a solid, liquid, gas, plasma, or any suitable mixture of materials. In an exemplary configuration, the coolant may be phase-changing, such as a wax melt. The selection of the coolant may depend on the heat-dissipating surface 38. In a configuration where the coolant is a fluid, or other moving coolant, the coolant may flow through the cooling mechanism 46, such that the coolant is directly delivered to the heat-dissipating surface 38 of the heat-dissipating device 36. The source may be a pumped source such that the cooling mechanism 46 includes a forced convection loop. In a configuration where the coolant is a solid, the coolant may be arranged within the cooling mechanism 46 for direct thermal contact with the heat-dissipating device 36.

In still another exemplary configuration, the heat-dissipating device 36 may include a heating mechanism having a structure similar to the structure of the cooling mechanism 46. The heating mechanism may be configured to deliver heat to at least one surface of the device 36. The heating mechanism may include at least one passage that is configured to deliver a heating medium to the surface. The heating mechanism may be printed directly on the device 36 and fluidly sealed to the device 36 such that the heating medium is in thermal contact directly with the surface to be heated.

The additively manufactured cooling mechanism 46 may be formed in any suitable arrangement for cooling the heat-dissipating surface 38. For example, the cooling mechanism 46 may include at least one hollow feature, such as a channel 48 in communication with the heat-dissipating surface 38. The hollow feature may be unsupported without using additional material, but any suitable shape may be used to reinforce or support the hollow feature if such support is needed. The hollow feature may be coated on an interior surface or an exterior surface of the hollow feature. The coating may be formed of any suitable material. The at least one channel 48 may be a micro-sized channel that extends along a length of the MMIC part of the heat-dissipating device 36. The cooling mechanism 46 may include at least one micro-sized hose or micro-hose 50 that is contained within the micro-channel 48 and in fluid communication with the coolant source 40. The at least one micro-hose 50 may include an inlet hose 52 that acts as a fluid supply path 52 and an outlet hose 54 that acts as a fluid return path 54. The supply path 52 and the return path 54 may be separate hoses that are both configured to extend across the heat-dissipating device 36. The at least one micro-hose 50, 52, 54 may be in fluid communication with connectors 56 that are also in fluid communication with the source 40. The connectors 56 may be fittings, valves, or any suitable connecting device. In an arrangement where the coolant is in the form of a fluid, the connectors 56 may also be in fluid communication with a pressure gauge, switch, or other fluid regulating device for regulating and/or measuring flow of the coolant.

Forming the cooling mechanism 46 directly on the heat-dissipating surface 38 is advantageous in that additional bulky components may be eliminated and standard fittings may be adapted for use between the cooling source 40 and the cooling mechanism 46. For example, the cooling mechanism 46 may eliminate the need for the heat spreader 32, the automated bonded layer 30, and/or the thermal interface 34, as used in the conventional module 20 of FIG. 1. Thus the overall weight of the heat-dissipating structure may be significantly reduced. Using an additive manufacturing process to form the cooling mechanism 46 is also advantageous in that small and complex hollow geometries of the cooling mechanism 46 may be formed on the heat-dissipating surface 38. Additive manufacturing enables the cooling mechanism 46 to be formed with serpentine and integrated fluid passages through the heat-dissipating device 36. Additive manufacturing also enables forming the cooling mechanism 46 on numerous surfaces of a heat-dissipating device 36 that may have a complex shape or small size.

Another advantage to implementing the cooling mechanism 46 within the heat-dissipating device 36 is that the heat-dissipating device 36 may be contained within a same volume or a lesser volume of the heat-dissipating device 36 or electronic module, as compared with the conventional module 20. Still another advantage of using the cooling mechanism 46 is that the cooling mechanism 46 being printed directly on the heat-dissipating surface 38 enables coolant to directly contact the heat-dissipating surface 38. The cooling mechanism 46 is fluidly sealed to the heat-dissipating surface 38 without using an additional bonding process or material. As compared with the conventional module 20, delivering fluid directly to the device may enable around twice as much power outputted from the heat-dissipating device 36. In an exemplary configuration, the power dissipation of the heat-dissipating device 36 having the additively manufactured cooling mechanism may be as high as 220 watts or higher. The power dissipation of the heat-dissipating device 36 may depend on the application.

Referring in addition to FIGS. 3 and 4, the supply path 52 and the return path 54 may be arranged within the channel 48. As shown in FIG. 3, the supply path 52 and the return path 54 may be arranged in parallel with one another, such that each of the supply path 52 and the return path 54 are in fluid communication with the coolant source and the surface to be cooled. In another arrangement, the supply path 52 and the return path 54 may be arranged in series with one another, such that a single coolant flow may be able to flow consecutively through the supply path 52 and the return path. The parallel paths enable low pressure drops through the channel 48 and thus high cooling efficiency. The parallel supply and return routing also eliminates thermal gradients across the assembly. The channel 48 may have a diameter of around 0.250 centimeters, but the channel may have any suitable diameter and the diameter may depend on the diameters of the micro-hoses. The dimensions of the micro-hoses 52, 54 may be optimized for flow and pressure drop. An example of a suitable diameter for the micro-hoses 52, 54 may fall in a range between 0.025 centimeters and 0.102 centimeters, but smaller and larger diameters may be achievable. The micro-hoses may have a wall thickness of 0.012 centimeters, but the thickness may be smaller or larger between 0.001 or smaller, up to 0.1 cm or larger. The dimensions of the micro-hoses may be selected to achieve a particular power output. The micro-hoses 52, 54 may be formed to achieve a flow rate of the cooling medium that is between 6 and 7 milliliters per second, but the micro-hoses (supply and return paths) 52, 54 may be dimensioned to achieve any suitable pressure drop and/or flow rate. Low flow rates generally may reject high heat flux levels. The micro-hoses 52, 54 may also be configured to support a cooling medium having a particular temperature. In an exemplary configuration of the micro-hoses, the coolant temperature entering the inlet hose 52 may be around 45 degrees Celsius and the temperature of the coolant leaving the outlet hose 54 may be around 55 degrees Celsius. The micro-hoses may be configured for other coolant temperatures, depending on the coolant used and the particular application of the heat-dissipating device 36.

Referring in addition to FIGS. 5A-6B, the micro-hoses may have any suitable shape and the shape may be dependent on the application. The micro-hoses may have shapes that are all the same or different. The channel 48 may also be formed to have a shape complementary to the shape of the micro-hose. Exemplary configurations are shown in FIGS. 5A and 5B. As shown in FIG. 5A, the channel 48 may be formed to have a diamond-shape aperture 50 that extends through the channel 48. The height of the diamond-shape aperture 50 may be less than a height of the channel 48, which may be around 1 millimeter. The channel 48 and the aperture 50 may have any suitable dimensions. The channel 48 may have a width of around 0.012 centimeters to accommodate both the inlet and outlet micro-hose that are arranged parallel to one another. All of the apertures 50 within the channel 48 may have the same shape and the micro-hoses may have a complementary shape. As shown in FIG. 5B, the micro-hoses may have different shapes, such as a hemicircular shape 58, a diamond shape 60, or a circular shape 62. Another suitable shape may be a pentagonal shape.

As shown in FIGS. 6A and 6B, the micro-hose may have a triangular shape 63 printed on the heat-dissipating surface 38. As shown in FIG. 6B, the heat-dissipating surface may be a printed wire board 22. The channel 48 and the micro-hoses may be printed directly to the printed wire board 22. The channel 48 may be in communication with a coolant source via the connectors 56.

Figure 7:
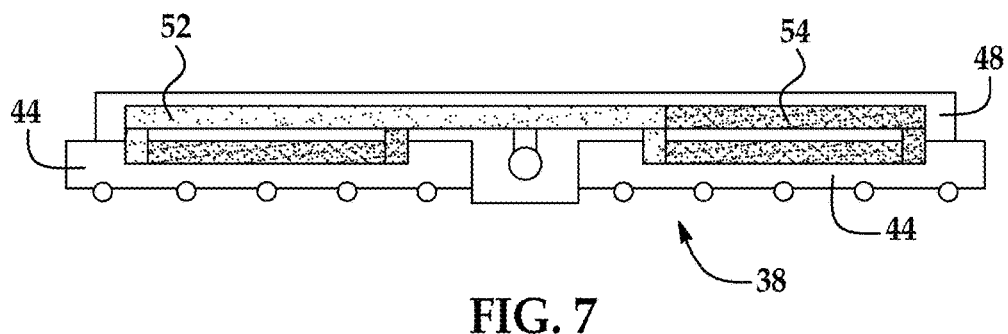
FIG. 7 is a schematic drawing showing the micro-hoses configured in a parallel arrangement.
Figure 8:
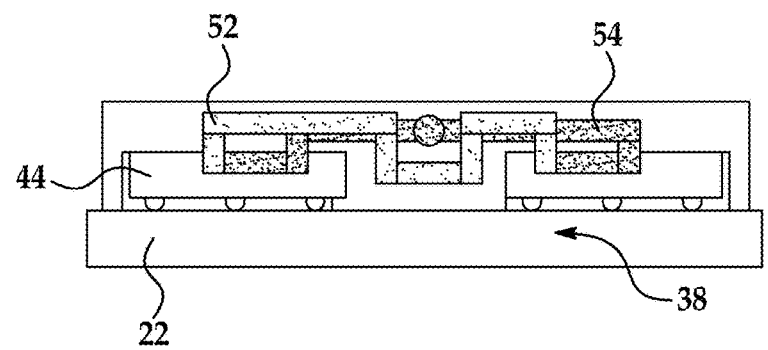
FIG. 8 is a schematic drawing showing the micro-hoses overlapping with one another.
Figure 9A:
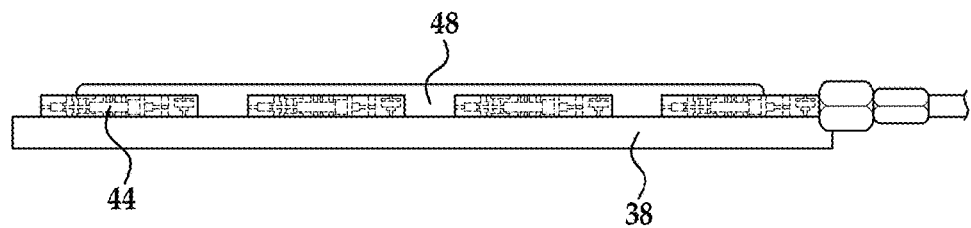
FIG. 9A is a schematic drawing showing the side of the printed circuit board.
Figure 9B:
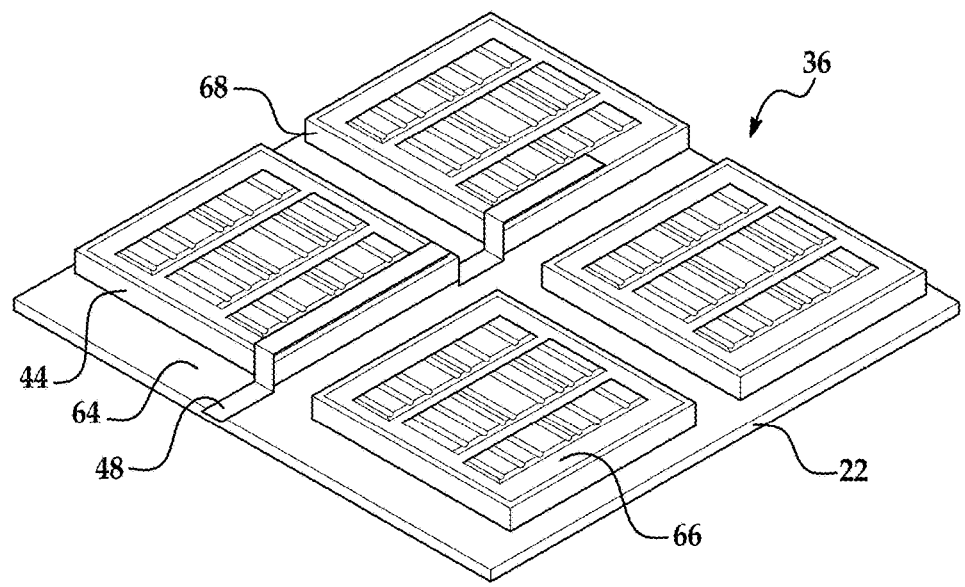
FIG. 9B is a schematic drawing showing an isometric view of the printed circuit board.

Referring now to FIGS. 7-9B, the heat-dissipating device 38 may include a plurality of circuit devices 44, such as MMICs, that are arranged parallel to one another and spaced apart on a top portion of the printed wire board 22. As shown in FIG. 7, the supply path 52 and the return path 54 of the channel 48 may be arranged in parallel to each of the plurality of MMICs 44. As shown in FIG. 8, another suitable configuration may include the supply path 42 and the return path 54 overlapping or crisscrossing over one another, such that the cooling medium of each path does not mix with the cooling medium of the other path. As best shown in FIGS. 9A and 9B, the channel 48 may be formed over and/or around each of the plurality of MMICs 44 such that the path of the channel 48 may be serpentine, winding, or circuitous.

As best shown in FIG. 9B, the printed cooling mechanism may be disposed on varying topography of the heat-dissipating device 36, such as on surfaces of differing heights and configurations. For example, the printed wire board 22 may have a top surface 64 and the plurality of circuit devices 44 may be arranged on the top surface 64. The plurality of circuit devices 44 may each also have a top surface 66 that is elevated relative to the top surface 64 of the printed wire board 22. The channel 48 may be printed to each the top surfaces 64, 66 of the printed wire board 22 and the circuit devices 44, such that the channel 48 is in thermal contact with each of the top surfaces 64, 66. The channel 48 may also be printed to an edge or side surface 68 of the device 44 or the printed wire board 22, such that the channel 48 travels across a first horizontal surface, or the top surface 64 of the printed wire board 22, along a vertical surface, or the side surface 68 of the circuit device 44, and across a second horizontal surface, or the top surface 66 of the circuit device 44. The channel 48 may be formed to wrap around the heat-dissipating device 36. The channel 48 may also contain the micro-hoses that are printed directly onto the plurality of circuit devices 44.

A method of forming the heat-dissipating device 36 includes using an additive manufacturing process to form the cooling mechanism 46 directly on the heat-dissipating surface 38 of the heat-dissipating device 36. The cooling mechanism 46 may be formed during the forming of the heat-dissipating device 36 and the additive manufacturing process may include any suitable process. Examples of suitable processes include 3D printing, dispensing, lithography, atomic layer deposition, stencil or screen printing, fused deposition modeling, stamp transfer, vapor deposition, sintering, transient liquid phase sintering, lamination, plating, dipping, brush coating, or spray coating. The micro-hoses 50 may be formed of electrically compatible materials such as polyimide, benzocyclobutene, nylon, polyetheretherketone (PEEK), acrylonitrile-butadiene-styrene, acryl based plastic (ABS), poly-lactic acid (PLA), or any other suitable polymeric materials that may withstand heat. A polyimide with an acrylic-based adhesive, such as Pyralux (a Registered Trademark of the Du Pont Company) may be a suitable material and lamination may be a suitable process. The micro-hoses and other features of the cooling mechanism may be formed of any materials that are suitable for additive manufacturing. Examples of suitable materials include other polymeric materials, metallic materials, epoxies, dielectric materials, ceramic materials, aerogels, alloys typically used in soldering, foams, hydrocarbons, semiconductors, and composite materials. Still other suitable materials include glass, crystal, amorphous materials, mesh materials, and semiconductors.

In a configuration where the micro-hose is formed of a polymer, the method may include printing the micro-hose 50 directly onto a blank circuit card. A conventional 3D printer may be used to dispense the polymer and the printer may be operable at any temperature that is suitable for making the polymer adhesive. Suitable operating temperatures may be between 210 degrees Celsius and 250 degrees Celsius but other temperatures may be suitable, depending on the polymeric material. Ultraviolet light may be used to cure an epoxy-type polymer.

As shown in FIG. 9B, the method may further include printing the cooling mechanism onto a first heat-dissipating surface of the heat dissipating device, such as the top surface 64 of the printed wire board 22. The method may further include printing the cooling mechanism onto a second heat-dissipating surface, such as the top surface 66 of the MMIC 44. The cooling mechanism may be in simultaneous thermal contact with both the printed wire board 22 and the MMIC 44, such that the coolant is directly delivered to both components. As previously described, the top surfaces 64, 66 may also have varying heights such that the path of the cooling mechanism curves around the heat-dissipating device 36.

Referring now to FIGS. 10A-10D, the additive manufacturing method may include applying a polymer coating over a sacrificial molding material to form hollow features of the cooling mechanism. The sacrificial molding material 70 may be used to define and maintain a hollow feature, such as a flow passage or the channel 48, during the additive manufacturing process. After the desired feature has been formed by the additive manufacturing process, the sacrificial material 70 may be removed. For example, vertically extending walls 69 of the channel 48 may be built up in a layer-by-layer additive manufacturing process and the sacrificial material 71 may be dispensed to form the desired shape of the channel 48. The sacrificial material may be dispensed using a 3D printer, dispensing system, syringe, manual dispensing mechanism such as a tube or bottle, photo-patterning, stencil printing, or any method suitable for forming a pattern on a surface. The sacrificial material may be removed by melting, dissolving using a chemical solution, or physically displaced by force or pressure. The sacrificial material may be a polymer, wax, metal, metal alloy, hydrocarbon, plastic or any suitable material.

Figure 10A:
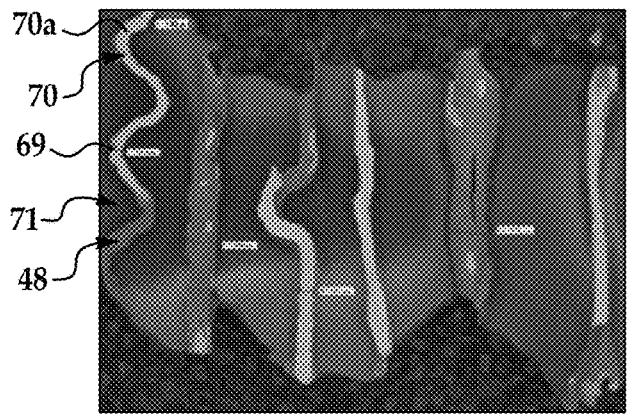
FIG. 10A is a drawing showing an exemplary method of forming printed cooling channels on the circuit board.
Figure 10B:
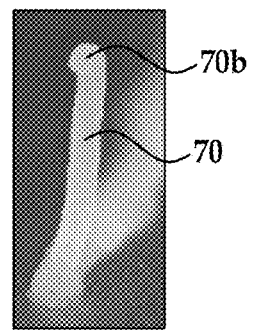
FIG. 10B is a drawing showing an exemplary shape of the cooling channel formed by the method shown in FIG. 10A.
Figure 10C:
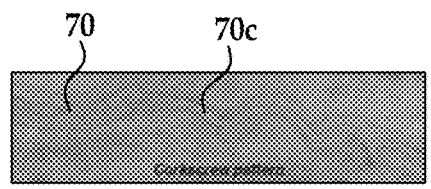
FIG. 10C is a drawing showing another exemplary shape of the cooling channel formed by the method shown in FIG. 10A.
Figure 10D:
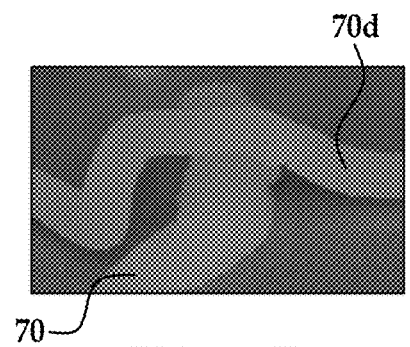
FIG. 10D is a drawing showing still another exemplary shape of the cooling channel formed by the method shown in FIG. 10A.

As best shown in FIG. 10A, the sacrificial material 70 may be dispensed as a paste to form beads of various diameters to define the channel 48, or other hollow features of the cooling mechanism. A dielectric paste 71 may be dispensed over the beads to form an exterior portion of the channel 48. The dielectric paste 71 may conform to the shape of the beads without fully mixing with the sacrificial paste 70, enabling the sacrificial paste 70 to be removed. As shown in FIG. 10A, the channel 48 may be formed to have a curved shape 70a, but any suitable shapes may be formed. The channels 48 may be straight or have varying diameters. The channels may have T-shaped or Y-shaped intersections. As shown in FIGS. 10B-10D, the sacrificial paste may also form self-supporting structures. For example, the sacrificial paste 70 may form pillars 70b as shown in FIG. 10B, corkscrews 70c as shown in FIG. 10C, or crossovers 70d as shown in FIG. 10D. The channel 48 may have diameters ranging between 10 and 15 millimeters, but any suitable diameters may be formed. The dielectric paste 71 may have a melting point at around 100 degrees Celsius, such that the dielectric paste may be cured using ultraviolet light and the sacrificial paste 70 may be cleared out of the narrow channels.

Figure 11:
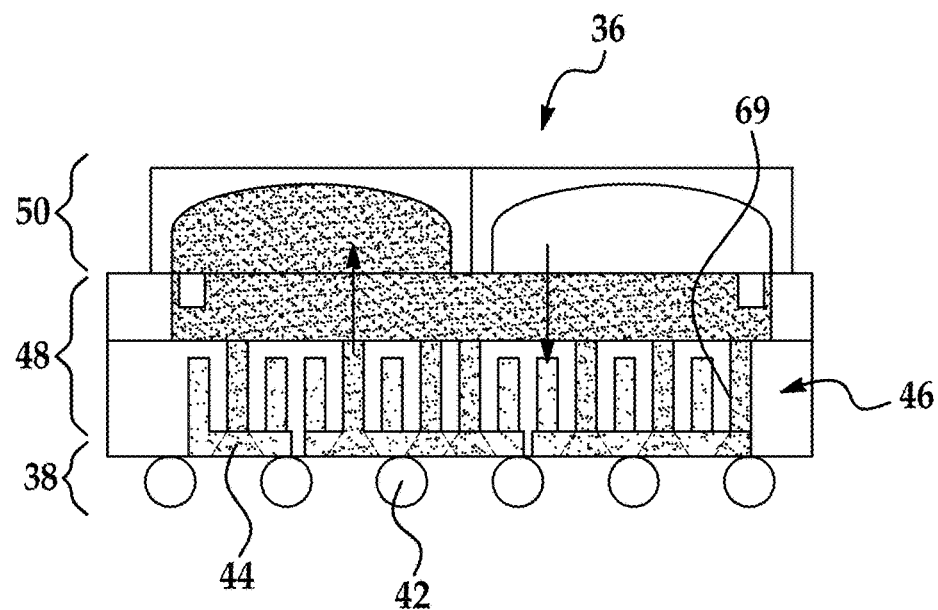
FIG. 11 is a schematic drawing showing a cross-sectional view of the printed circuit board.

Referring now to FIG. 11, a schematic drawing shows greater detail of the interface formed between the printed micro-hose 50 and the heat-dissipating surface 38 within the heat-dissipating device 36 or electronic module. The heat-dissipating surface 38 may include the plurality of MMICs 44 and the circuit bumps 42 as previously described. At least a portion of the heat-dissipating surface 38 may be formed of gallium nitride. As also previously described, the channel 48 is printed directly to the MMICs 44, allowing coolant to be fluidly sealed against the heat-dissipating surface. The channel 48 may be micro-sized and has vertically extending walls 69 to define the channel 48. The micro-sized channels may be formed of silicon or any material suitable for additive manufacturing.

Figure 12:
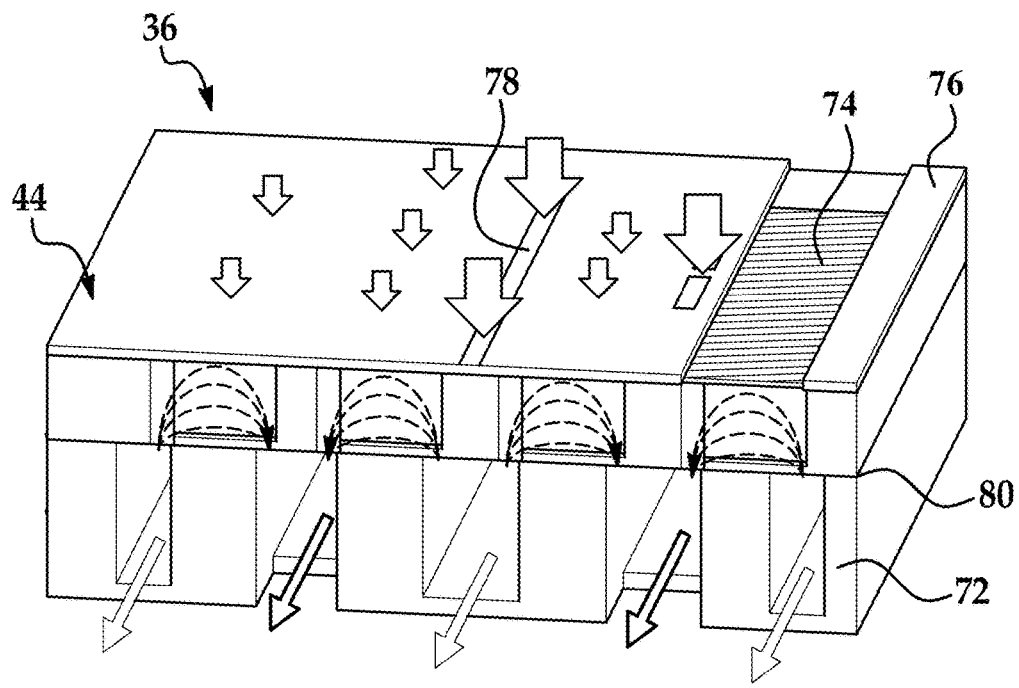
FIG. 12 is a schematic drawing showing a heat-dissipating device in the form of a monolithic microwave integrated circuit (MMIC).

Referring now to FIG. 12, another exemplary configuration of the additively manufactured cooling mechanism 46 is shown in the heat-dissipating device 36. The heat-dissipating device 36 may be in the form of an MMIC chip with fluid channels including supply and return paths at the chip or wafer level. The MMIC chip is an exemplary device and any other suitable heat-dissipating device may be used. The cooling mechanism 46 may be implemented for microfluidic MMIC intra-chip cooling. The heat dissipating surface, or the MMIC 44 may include a silicon fluid manifold 72 and intra-chip micro-channels 74 formed by ionic or chemical etching process. The fluid manifold 72 distributes fluid to the short flow length micro-channels 74, maximizing heat transfer performance and thermos-fluid efficiency. The micro-channels 74 may each have a thickness of between 20 and 30 microns. The micro-channels 74 spread high electron mobility transistor heat fluxes to manageable levels and provide high fin efficiency to minimize convective thermal resistance. The MMIC 44 may include a field-effect transistor 78 for increased power density.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A heat-dissipating device comprising:
   at least one heat-dissipating surface, and
   a cooling channel formed directly on the at least one heat-dissipating surface;
   wherein the cooling channel includes at least one fluid supply path and at least one fluid return path that extend over the at least-one heat-dissipating surface and carry a cooling medium, the at least one fluid supply path and the at least one fluid return path extending along a common plane that is adjacent and parallel to the one heat-dissipating surface, and
   wherein the cooling channel is fluidly sealed to the at least one heat-dissipating surface, the cooling medium being in thermal contact directly with the heat-dissipating surface.

2. The heat-dissipating device of claim 1, wherein the at least one fluid supply path and the at least one fluid return path are parallel to one another.

3. The heat-dissipating device of claim 1, wherein the at least one fluid supply path and the at least one fluid return path are configured to overlap without mixing the cooling medium of each of the at least one fluid supply path and the at least one fluid return path.

4. The heat-dissipating device of claim 1, wherein the cooling channel includes at least one additively manufactured micro-hose, the at least one fluid supply path being formed by a fluid supply micro-hose and the at least one fluid return path being formed by a fluid return micro-hose.

5. The heat-dissipating device of claim 4, wherein the at least one micro-hose is formed of polyimide, epoxy, ultem, benzocyclobutene, nylon, polyetheretherketone, acrylonitrile-butadiene-styrene, acryl-based polymer, or polylactic acid.

6. The heat-dissipating device of claim 1, wherein the heat-dissipating device includes a first heat-dissipating surface and a second heat-dissipating surface arranged on the first heat-dissipating surface, the at least one fluid passage being arranged over the first heat-dissipating surface and the second heat-dissipating surface.

7. The heat-dissipating device of claim 6, wherein each of the first heat-dissipating surface and the second heat-dissipating surface includes a horizontal portion and a vertical portion, the cooling channel extending along the horizontal portion and the vertical portion of each of the first heat-dissipating surface and the second heat-dissipating surface, the cooling channel wrapping around the heat-dissipating device.

8. The heat-dissipating device of claim 1, wherein each of the at least one fluid supply path and the at least one fluid return path has at least one exterior wall that defines the path, the exterior wall having a shape that is a triangle, pentagon, diamond, circle, or hemi-circle.

9. The heat-dissipating device of claim 8, wherein the cooling channel has a shape that is complementary to the shape of the at least one fluid supply path and the at least one fluid return path.

10. The heat-dissipating device of claim 1, wherein the heat-dissipating device includes at least one pumped coolant source that is in communication with the heat-dissipating surface via the cooling channel.

11. The heat-dissipating device of claim 1, wherein the heat-dissipating device includes:
    at least one surface to be heated; and
    a heating mechanism formed directly on the at least one surface to be heated;
    wherein the heating mechanism includes at least one fluid passage for carrying a heating medium, and
    wherein the heating mechanism is fluidly sealed to the at least one surface, the heating medium being in thermal contact directly with the at least one surface.

12. The heat-dissipating device of claim 1, wherein the at least one fluid supply path and the at least one fluid return path have a common shape.

13. A printed circuit board having at least one active or passive circuit, the printed circuit board comprising:
    a printed wire board;
    a cooling medium source; and
    a cooling channel printed directly to the printed wire board, the cooling channel containing a fluid supply micro-hose and a fluid return micro-hose that are in fluid communication between the cooling medium source and the printed wire board, the fluid supply micro-hose delivering a cooling medium directly to the printed wire board,
    wherein the fluid supply micro-hose and the fluid return micro-hose extend along a common plane that is adjacent and parallel to the printed wire board.

14. The printed circuit board of claim 13, further including a monolithic microwave integrated circuit arranged on the printed wire board, wherein the cooling channel has a serpentine path that extends over the printed wire board and the monolithic integrated circuit.

15. A method of forming a heat-dissipating device comprising:
    using an additive manufacturing process to form a cooling channel directly on a heat-dissipating surface of the heat-dissipating device,
    wherein the cooling channel includes at least one fluid supply path and at least one fluid return path that extend over the at least-one heat-dissipating surface and carry a cooling medium to the heat-dissipating surface, the at least one fluid supply path and the at least one fluid return path extending along a common plane that is adjacent and parallel to the one heat-dissipating surface, and
    wherein the cooling mechanism is fluidly sealed to the at least one heat-dissipating surface for direct thermal contact between the cooling medium and the at least one heat-dissipating surface.

16. The method of claim 15, wherein using the additive manufacturing process includes at least one of 3D printing, dispensing, lithography, atomic layer deposition, stencil or screen printing, fused or vapor deposition, stamp transfer, sintering, and lamination.

17. The method of claim 15, wherein forming the cooling channel includes forming a fluid supply micro-hose and a fluid return micro-hose, the fluid supply micro-hose configured to deliver the cooling medium to the at least one heat-dissipating surface.

18. The method of claim 17, wherein forming the channel includes forming the fluid supply micro-hose and the fluid return micro-hose to be parallel with one another.

19. The method of claim 15, wherein forming the heat-dissipating device includes forming a printed circuit board assembly.

20. The method of claim 19, further including:
printing the cooling channel onto a printed wire board of the circuit board; and
printing the cooling channel onto a second circuit device arranged on the printed wire board,
wherein the cooling channel is in simultaneous thermal contact with the printed wire board and the second circuit device.

\* \* \* \* \*